(12) United States Patent
Park (10) Patent No.: US 7,777,543 B2
(45) Date of Patent: Aug. 17, 2010

(54) DUTY CYCLE CORRECTION CIRCUIT APPARATUS

(75) Inventor: Dong-uk Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/401,786

(22) Filed: Mar. 11, 2009

(65) Prior Publication Data

US 2009/0251184 A1 Oct. 8, 2009

(30) Foreign Application Priority Data

Apr. 8, 2008 (KR) .................. 10-2008-0032662

(51) Int. Cl.
*H03K 5/04* (2006.01)

(52) U.S. Cl. .................. 327/175; 327/172; 327/176; 327/298

(58) Field of Classification Search ......... 327/172–176, 327/144, 146, 152, 155, 159, 161, 99, 298, 327/31, 35, 36

See application file for complete search history.

(56) References Cited

U.S. PATENT DOCUMENTS

| 6,653,043 | B1 | 11/2003 | Hanabata |
| 6,653,876 | B2 | 11/2003 | Issa et al. |
| 7,500,033 | B2 * | 3/2009 | Teil et al. .................. 710/105 |

FOREIGN PATENT DOCUMENTS

KR    20020056258    7/2002

* cited by examiner

*Primary Examiner*—An T Luu
(74) *Attorney, Agent, or Firm*—Stanzione & Kim, LLP (57) ABSTRACT

A duty cycle correction circuit apparatus includes a flip-flop, a feedback unit connected between an input node and an output node of the flip-flop to invert an output signal of the flip-flop and to output the inverted signal as an output signal of the feedback unit, and a selection unit to select and output one of a first clock signal and a second clock signal to the flip-flop in response to the output signal of the feedback unit, wherein the first clock signal has a half-period phase difference with respect to the second clock signal. Using clock signals with a half-period phase difference therebetween and a simple digital circuit, the duty cycle correction circuit can correct a duty ratio to 50:50 regardless of an initial condition.

20 Claims, 8 Drawing Sheets

DUTY CYCLE CORRECTION CIRCUIT APPARATUS

CROSS-REFERENCE TO RELATED APPLICATIONS

This application claims priority under 35 U.S.C. §119(a) from Korean Patent Application No. 10-2008-0032662, filed on Apr. 8, 2008, in the Korean Intellectual Property Office, the disclosure of which is incorporated herein in its entirety by reference.

BACKGROUND

1. Field of the Invention

The present general inventive concept relates to a duty cycle correction circuit apparatus to correct a duty ratio, and more particularly, to an electronic apparatus having a simple duty cycle correction circuit apparatus which can correct a duty ratio to 50:50.

2. Description of the Related Art

Generally, devices operating at high speed, such as analog to digital (A/D) converters and double data rate synchronous dynamic random access memory (DDR SDRAM), are activated by both a rising edge and falling edge of a clock signal. In a case that both a rising edge and a falling edge of a clock signal are used, it is important to maintain a duty ratio of 50:50 in order to improve design margin. In addition, since another duty ratio might be used if necessary, there also is a need to maintain a duty ratio desired by a designer.

Thus, in a dynamic random access memory (DRAM), various interface systems, etc., a conventional duty cycle correction circuit corrects a duty ratio close to 50:50. A conventional duty cycle correction circuit corrects a received single input clock signal in an analog manner, and thus a complicated operation is required. In addition, in a system using multiphase clock signals, duty cycle correction circuits are required as many as multiphase clock signals.

SUMMARY

The present general inventive concept provides a duty cycle correction unit that can correct a duty ratio to 50:50 using a simple digital circuit, and an electronic apparatus having the duty cycle correction unit.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a duty cycle correction circuit apparatus including a flip-flop, a feedback unit connected between an input node and an output node of the flip-flop to invert an output signal of the flip-flop and to output the inverted signal as an output signal of the feedback unit, and a selection unit to select and output one of a first clock signal and a second clock signal to the flip-flop in response to the output signal of the feedback unit, wherein the first clock signal may have a half-period phase difference with respect to the second clock signal.

The selection unit may output the first clock signal when the output signal of the feedback unit is in a first logic state, and the selection unit may output the second clock signal when the output signal of the feedback unit is in a second logic state.

The duty cycle correction circuit may further include a phase frequency detector comparing a reference clock signal and an internal clock signal so as to detect a phase difference therebetween; a charge pump and loop filter outputting a voltage signal in response to an output signal of the phase frequency detector; and a voltage controlled oscillator outputting the internal clock signal in response to the voltage signal.

The voltage controlled oscillator may output a plurality of clock signals with different phases, and the first clock signal and the second clock signal may be clock signals with a half-period phase difference therebetween from among the clock signals output by the voltage controlled oscillator.

The duty cycle correction circuit may further include a phase frequency detector comparing a reference clock signal and an internal clock signal so as to detect a phase difference therebetween; a charge pump and loop filter outputting a voltage signal in response to an output signal of the phase frequency detector; and a voltage controlled delay line outputting the internal clock signal in response to the voltage signal.

The voltage controlled delay line may output a plurality of clock signals with different phases, and the first clock signal and the second clock signal may be clock signals with a half-period phase difference therebetween from among the clock signals output by the voltage controlled delay line.

The foregoing and/or other aspects and utilities of the present general inventive concept may also be achieved by providing a duty cycle correction circuit apparatus including a flip-flop, a feedback unit connected between an input node and an output node of the flip-flop to invert an output signal of the flip-flop and to output the inverted signal as an output signal of the feedback unit, and a selection unit to select and output one of a first clock signal and a second clock signal to the flip-flop in response to the output signal of the feedback unit, a first inversion unit to invert the output signal of the flip-flop and outputting the inverted signal as an output signal of the first inversion unit, a delay unit to delay the output signal of the first inversion unit by the delay during which the output signal of the feedback unit is transmitted via the flip-flop, and a second inversion unit to invert an output signal of the delay unit and to output the inverted signal as an output signal of the second inversion unit, wherein the first clock signal may have a half-period phase difference with respect to the second clock signal.

The duty cycle correction circuit may further include a phase frequency detector comparing a reference clock signal and an internal clock signal so as to detect a phase difference therebetween; a charge pump and loop filter outputting a voltage signal in response to an output signal of the phase frequency detector; and a voltage controlled oscillator outputting the internal clock signal in response to the voltage signal.

The voltage controlled oscillator may output a plurality of clock signals with different phases, and the first clock signal and the second clock signal may be clock signals with a half-period phase difference therebetween from among the clock signals output by the voltage controlled oscillator.

The duty cycle correction circuit may further include a phase frequency detector comparing a reference clock signal and an internal clock signal so as to detect a phase difference therebetween; a charge pump and loop filter outputting a voltage signal in response to an output signal of the phase frequency detector; and a voltage controlled delay line outputting the internal clock signal in response to the voltage signal.

The voltage controlled delay line may output a plurality of clock signals with different phases, and the first clock signal and the second clock signal may be clock signals with a half-period phase difference therebetween from among the clock signals output by the voltage controlled delay line.

The foregoing and/or other aspects and utilities of the present general inventive concept may also be achieved by providing an electronic apparatus including a memory unit having a duty cycle correction unit having a flip-flop, a feedback unit connected between an input node and an output node of the flip-flop to invert an output signal of the flip-flop and to output the inverted signal as an output signal of the feedback unit, and a selection unit to select and output one of a first clock signal and a second clock signal to the flip-flop in response to the output signal of the feedback unit, the memory unit further having a memory to store or read data according to the output signal of the flip flop. The first clock signal may have a half-period phase difference with respect to the second clock signal.

The memory may include a first memory having a first transfer rate to read and write the data according to the output signal of the flip flop, and a second memory having a second transfer rate to read and write the data according to the output signal of the flip flop.

The foregoing and/or other aspects and utilities of the present general inventive concept may also be achieved by providing an electronic apparatus including a memory unit having a duty cycle correction unit having a flip-flop, a feedback unit connected between an input node and an output node of the flip-flop to invert an output signal of the flip-flop and to output the inverted signal as an output signal of the feedback unit, and a selection unit to select and output one of a first clock signal and a second clock signal to the flip-flop in response to the output signal of the feedback unit, the memory unit further having a memory to store or read data according to the output signal of the flip flop. The first clock signal may have a half-period phase difference with respect to the second clock signal. The electronic apparatus may further include an output unit to perform an operation according to the data of the memory unit.

The output unit may include one of a first unit to generate an image, a second unit to generate sound, and a third unit to communicate with an external device according to the data of the memory unit.

The foregoing and/or other aspects and utilities of the present general inventive concept may also be achieved by providing a duty cycle correction circuit apparatus including a circuit unit to receive at least one of first and second clock signals and to generate an output signal according to a state change of the at least one of the first and second clock signals, a feedback unit to invert the output signal of the circuit unit, and a selection unit to select one of the first clock signal and the second clock signal as the at least one clock signal according to the inverted output signal of the circuit unit.

BRIEF DESCRIPTION OF THE DRAWINGS

The above and other features and advantages of the present general inventive concept will become more apparent by describing in detail exemplary embodiments thereof with reference to the attached drawings in which.

DETAILED DESCRIPTION OF THE EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 1:
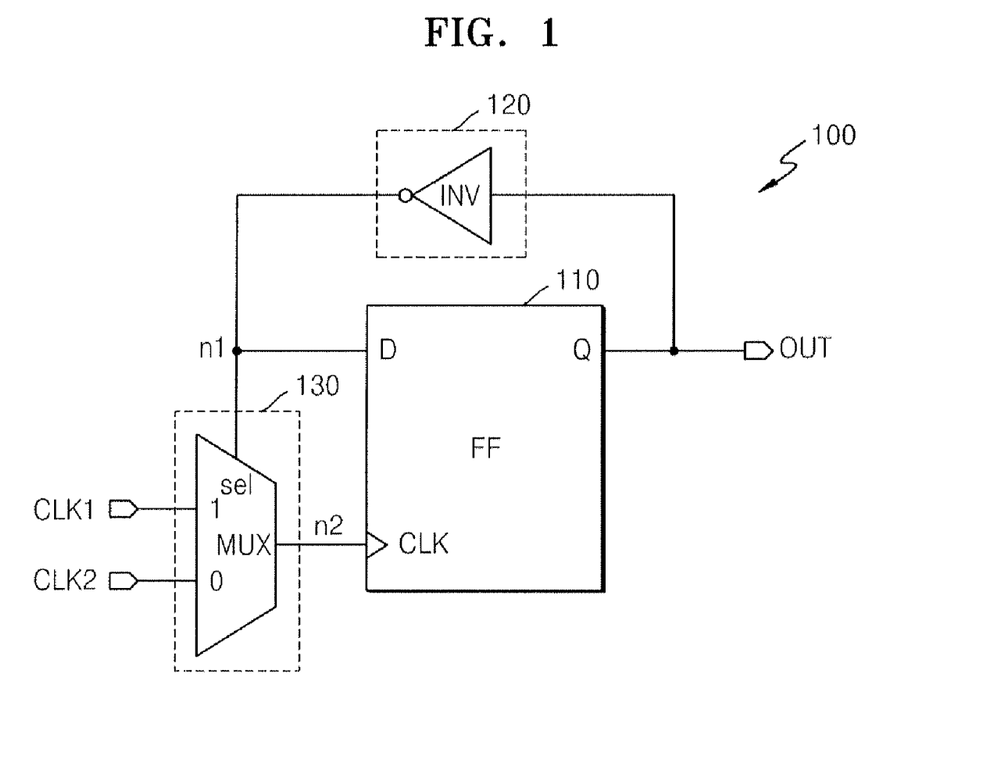
FIG. 1 is a block diagram illustrating a duty cycle correction circuit apparatus according to an embodiment of the present general inventive concept.

FIG. 1 is a block diagram illustrating a duty cycle correction circuit apparatus 100 according to an embodiment of the present general inventive concept.

Referring to FIG. 1, the duty cycle correction circuit apparatus 100 may include a circuit unit 110, a feedback unit 120 and a selection unit 130. The circuit unit 110 may be a flip-flop or a D flip-flop 110 to receive at least one of first and second clock signals and to generate an output signal according to a state change of the at least one of the first and second clock signals. The feedback unit 120 is connected between an input node D and an output node Q of the flip-flop 110, and inverts an output signal OUT output from the output node Q of the flip-flop 110 and transfers the inverted signal to the input node D of the flip-flop 110. The feedback unit 120 may be embodied as an inverter INV. In FIG. 1, the inverter INV may be disposed outside the flip-flop 110 as a separate element and inverts the output signal OUT of the flip-flop 110. However, it is possible that the inverter INV can be installed in the flop-flop 110 to generate the output signal and the inverted signal, or that the flop-flop 110 generates the inverted signal to be used in the input node D of the flip-flop 110 and to be used as the output signal OUT. For example, the flip-flop 110 can generate two different signals to correspond to the inverted signal and the output signal OUT. When an inversion output node of the flip-flop 110, from which an inversion output signal is transmitted, is connected directly to the input node D of the flip-flop 110. That is, an inverted signal of the output signal OUT of the flip-flop 110 can be transmitted to the input node D of the flip-flop 110 according to the present general inventive concept.

The selection unit 130 selects and transmits one of a first clock signal CLK1 and a second clock signal CLK2 to the flip-flop 110, in response to the inverted signal of the output signal OUT of the flip-flop 110, that is, an output signal n1 of the feedback unit 120. For example, when the output signal n1 of the feedback unit 120 is in a first logic state, the selection unit 130 may output the first clock signal CLK1, and when the output signal n1 of the feedback unit 120 is in a second logic state, the selection unit 130 may output the second clock signal CLK2. On the other hand, when the output signal n1 of the feedback unit 120 is in the first logic state, the selection unit 130 may output the second clock signal CLK2, and when the output signal n1 of the feedback unit 120 is in the second logic state, the selection unit 130 may output the first clock signal CLK1. In both these cases, the effect of the present invention can be achieved. Hereinafter, the first logic state and the second logic state refer to a logic high state and a logic low state, respectively. However, it will be obvious to one of ordinary skill in the art that the effect of the present invention can be achieved when the first logic state and the second logic state refer to the logic low state and the logic high state, respectively. A phase difference between the first clock signal CLK1 and the second clock signal CLK2 may be a half period, 180 degrees. The selection unit 130 may be embodied as a multiplexer (MUX).

Figure 2:
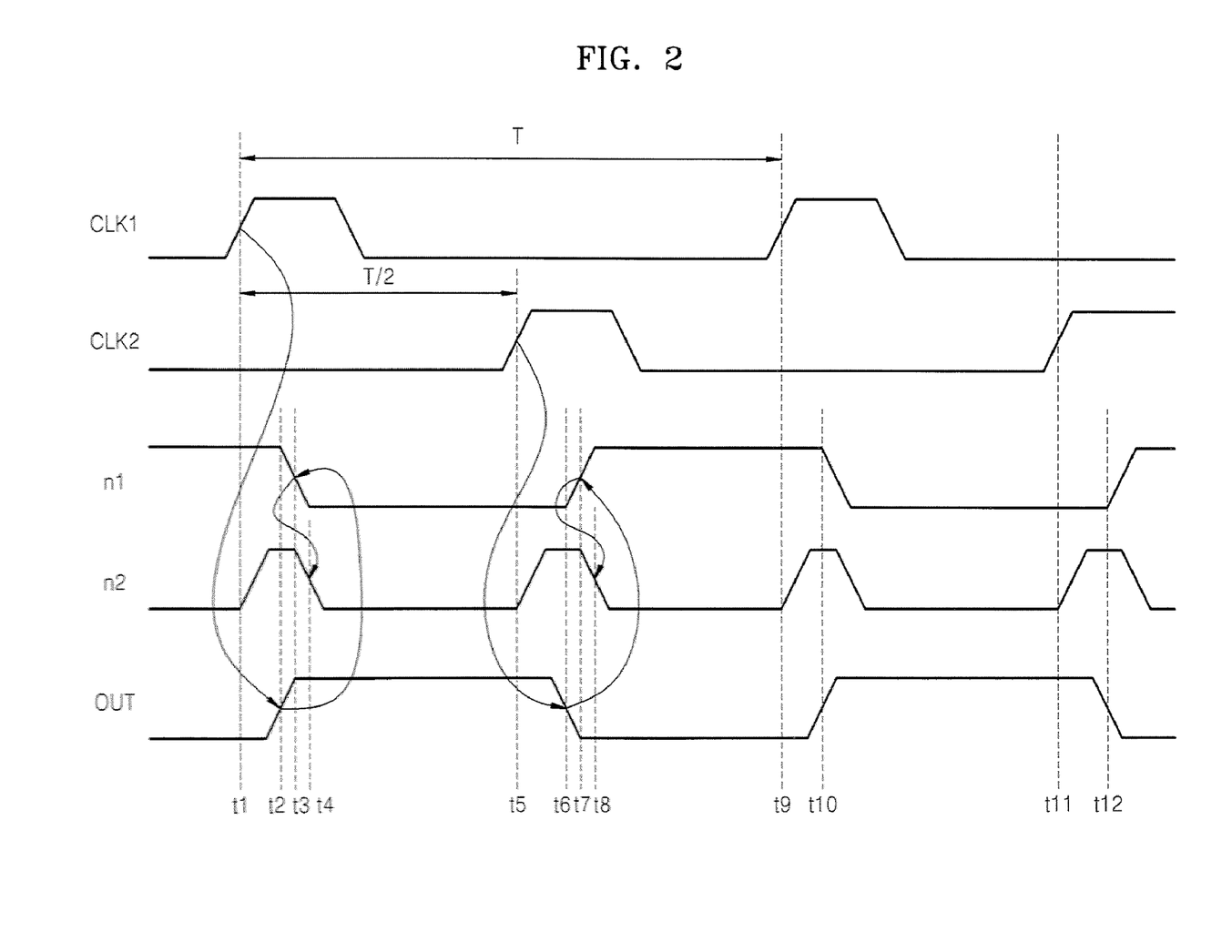
FIG. 2 is a waveform diagram illustrating an operation of the duty cycle correction circuit apparatus of FIG. 1.

FIG. 2 is a waveform diagram illustrating an operation of the duty cycle correction circuit 100 of FIG. 1.

Hereinafter, it is assumed that when the output signal n1 of the feedback unit 120 is in the first logic state, the selection unit 130 outputs the first clock signal CLK1, and when the output signal n1 of the feedback unit 120 is in the second logic state, the selection unit 130 outputs the second clock signal CLK2. However, it is possible to have the opposite case to the above-described case, the effect of the present general inventive concept can also be achieved.

Referring to FIGS. 1 and 2, since the output signal n1 of the feedback unit 120 is in the first logic state up to a point of time t1, the selection unit 130 outputs the first clock signal CLK1. Since the first clock signal CLK1 is in the second logic state up to the point of time t1, an output signal n2 of the selection unit 130 is in the second logic state up to the point of time t1.

At the point of time t1, since the first clock signal CLK1 changes from the second logic state to the first logic state, the flip-flop 110 outputs the output signal OUT in the first logic state via the output node Q. Thus, the output signal OUT of the flip-flop 110 changes from the second logic state to the first logic state at a point of time t2. A period of time between the time t1 and the time t2 is a time delay during which the output signal n1 of the feedback unit 120 is transmitted via the flip-flop 110. Since the output signal OUT of the flip-flop 110 is in the first logic state after the point of time t2, the output signal n1 of the feedback unit 120 changes to the second logic state at a point of time t3. A period of time between the time t2 and the time t3 is a time delay during which the output signal OUT of the flip-flop 110 is transmitted via the feedback unit 120. Since the selection unit 130 operates in response to the output signal n1 of the feedback unit 120, which is in the second logic state after the point of time t3, the selection unit 130 outputs the second clock signal CLK2. In this case, the second clock signal CLK2 is in the second logic state, the output signal n2 of the selection unit 130 changes to the second logic state at a point of time t4. Thus, the flip-flop 110 continues to output the output signal OUT in the first logic state, which has been output by the flip-flop 110 before. A period of time between the time t3 and the time t4 is a time delay during which the selection unit 130 operates in response to the output signal n1 of the feedback unit 120.

Then, since the second clock signal CLK2 changes from the second logic state to the first logic state at a point of time t5, the flip-flop 110 outputs the output signal OUT in the second logic state via the output node Q. Thus, the output signal OUT of the flip-flop 110 changes from the first logic state to the second logic state at a point of time t6. A period of time between t5 and t6 is a time delay during which the output signal n1 of the feedback unit 120 is transmitted via the flip-flop 110. Since the output signal OUT of the flip-flop 110 is in the second logic state after the point of time t6, the output signal n1 of the feedback unit 120 changes to the first logic state at a point of time t7. A period of time between the time t6 and time t7 is a time delay during which the output signal OUT of the flip-flop 110 is transmitted via the feedback unit 120. Since the selection unit 130 operates in response to the output signal n1 of the feedback unit 120, which is in the first logic state after the point of time t7, the selection unit 130 outputs the first clock signal CLK1. In this case, since the first clock signal CLK1 is in the second logic state, the output signal n2 of the selection unit 130 changes to the second logic state at a point of time t8. Thus, the flip-flop 110 continues to output the output signal OUT in the second logic state, which has been output by the flip-flop 110 before. A period of time between the time t7 and the time t8 is a time delay during which the selection unit 130 operates in response to the output signal n1 of the feedback unit 120.

According to the present embodiment, when a duty cycle is corrected, the output signal OUT of the flip-flop 110 is synchronized with a rising edge of the first clock signal CLK1 to change to the first logic state, and is synchronized with a rising edge of the second clock signal CLK2 to change to the second logic state. In FIG. 2, a difference between t1 and t9 is one period T, and a difference between the time t1 at the rising edge of the first clock signal CLK1 and the t5 at the rising edge of the second clock signal CLK2 is a half period T/2. That is, since a phase difference between the first clock signal CLK1 and the second clock signal CLK2 is a half period, the same logic state is maintained in the output signal OUT during the half period. Thus, the duty cycle correction circuit 100 can correct and output the output signal OUT to a duty ratio of 50:50 by using the rising edge of the first clock signal CLK1 and the rising edge of the second clock signal CLK2. In addition, according to the present embodiment, the duty cycle may be corrected regardless of an initial condition. That is, even if the flip-flop 110 is not reset, the flip-flop 110 can receive the first and second clock signals CLK1 and CLK2 whose phase difference therebetween is a half period and can operate as described above so as to correct the duct cycle.

Figure 3:
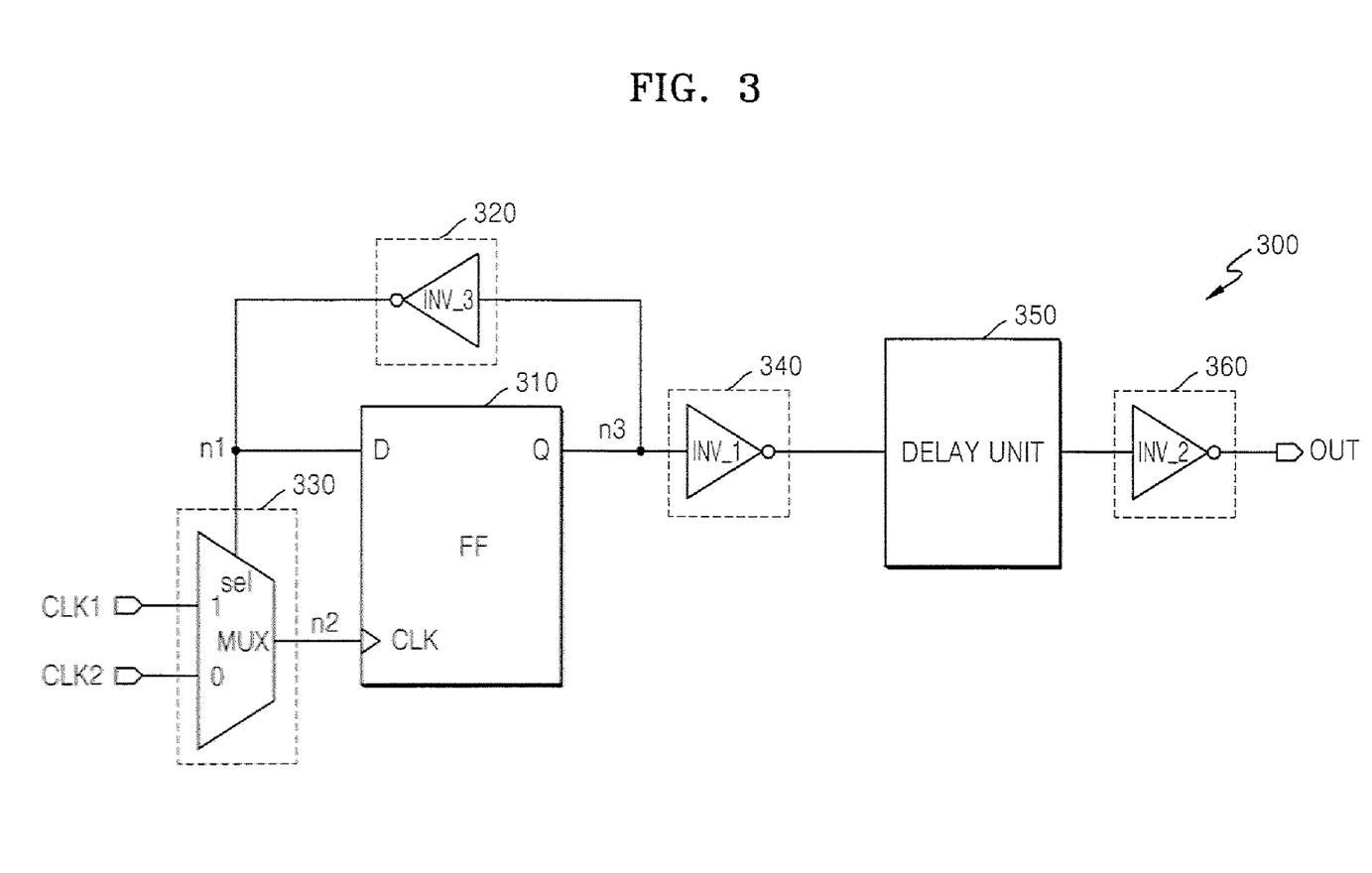
FIG. 3 is a block diagram illustrating a duty cycle correction circuit apparatus according to another embodiment of the present general inventive concept.

FIG. 3 is a block diagram illustrating a duty cycle correction circuit 300 according to another embodiment of the present general inventive concept.

Referring to FIGS. 1 and 3, the duty cycle correction circuit 300 includes a flip-flop 310, a feedback unit 320, a selection unit 330, a first inversion unit 340, a delay unit 350 and a second inversion unit 360.

Since the flip-flop 310, the feedback unit 320 and the selection unit 330 are respectively similar to the flip-flop 110, the feedback unit 120 and the selection unit 130 illustrated in FIG. 1 in terms of their configurations and operations, descriptions thereof will not be repeated. The first inversion unit 340 inverts an output signal of the flip-flop 310. The first inversion unit 340 may be embodied as an inverter INV_1. The delay unit 350 delays an output signal of the first inversion unit 340. The delay unit 350 delays an input signal by as much as a delay in the flip-flop 310. That is, the time delay in the delay unit 350 may be the same as the time delay between the transmission of input and output signals of the flip-flop 310. The delay unit 350 may have the same configuration as the flip-flop 310, and may also have a configuration in which an input signal is output regardless of a clock signal. In addition, the delay unit 350 may delay the input signal by using an inverter chain formed by connecting a plurality of inverters in series. The second inversion unit 360 inverts the output signal of the delay unit 350 and outputs an output signal OUT. The second inversion unit 360 may be embodied as an inverter INV_2.

Like in the case described with reference to FIG. 1, when an inversion output signal is used, the feedback unit 320 and the first inversion unit 340 may not be used. In addition, the feedback unit 320 and the first inversion unit 340 may be combined so as to be embodied as a single inverter. That is, since each of a signal input to the flip-flop 310 and a signal input to the delay unit 350 is a signal inverted from the output signal n3 of the flip-flop 310, when the single inverter inverts the output signal of the flip-flop 310 and then transmits the inverted signal to the flip-flop 310 and the delay unit 350, the same effect as when the feedback unit 320 and the first inversion unit 340 are used can be achieved.

Figure 4:
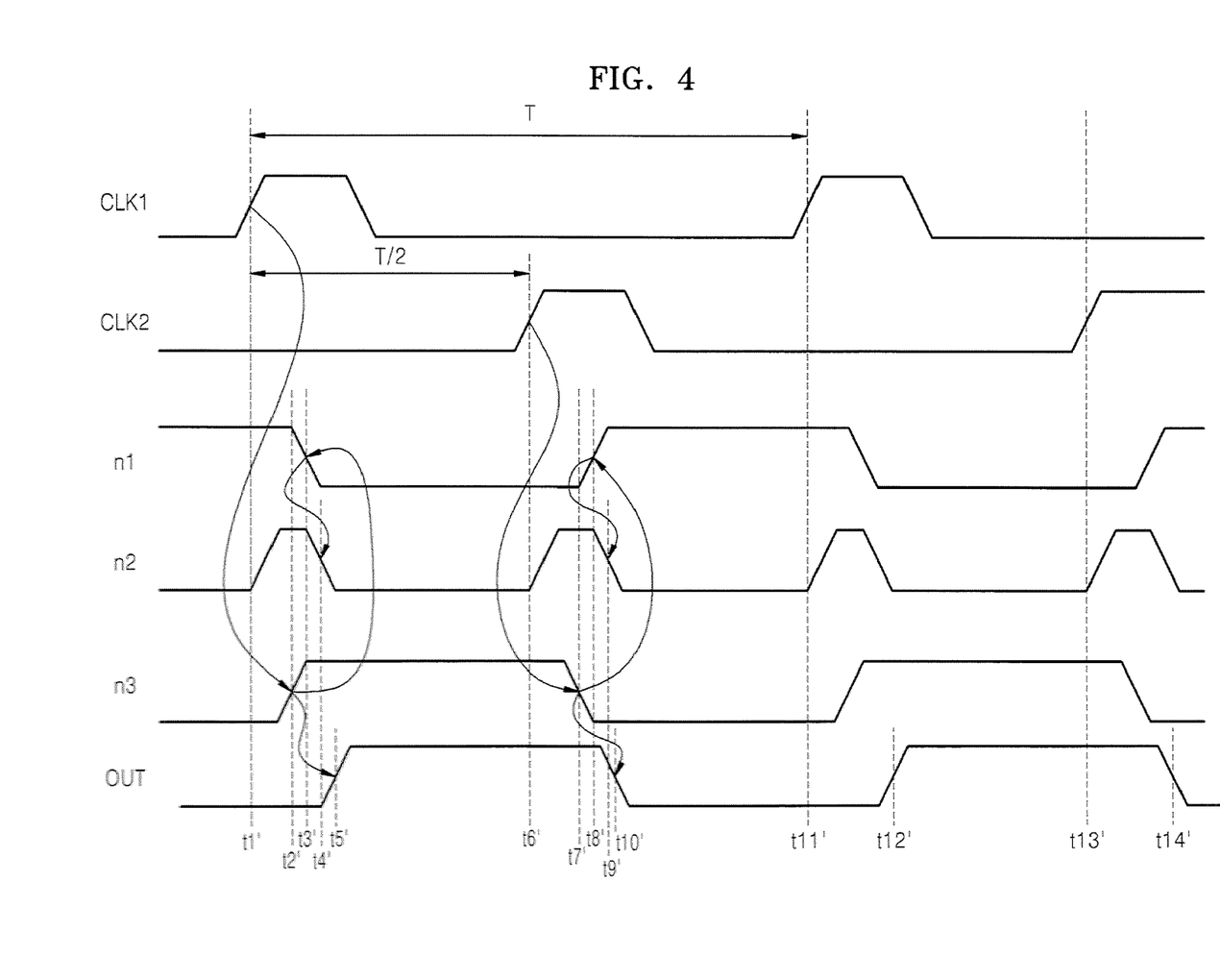
FIG. 4 is a waveform diagram illustrating an operation of the duty cycle correction circuit apparatus of FIG. 3.

FIG. 4 is a waveform diagram illustrating an operation of the duty cycle correction circuit 300 of FIG. 3.

Hereinafter, like in the case of FIG. 2, it is assumed that when an output signal n1 of the feedback unit 320 is in a first logic state, the selection unit 330 outputs a first clock signal CLK1, and when the output signal n1 of the feedback unit 320 is in a second logic state, the selection unit 330 outputs a second clock signal CLK2. However, it is possible to have the opposite case to the above-described case, the effect of the present general inventive concept can also be achieved.

Referring to FIGS. 3 and 4, since the output signal n1 of the feedback unit 320 is in the first logic state up to a point of time t1', the selection unit 330 outputs the first clock signal CLK1. Since the first clock signal CLK1 is in the second logic state up to the point of time t1', an output signal n2 of the selection unit 330 is in the second logic state. At the point of time t1', since the first clock signal CLK1 changes from the second logic state to the first logic state, the flip-flop 310 outputs an output signal n3 of the flip-flop 310 in the first logic state via an output node Q of the flip flop 310. Thus, the output signal n3 of the flip-flop 310 changes from the second logic state to the first logic state at a point of time t2'. A period of time between the time t1' and the time t2' is a time delay during which the output signal n1 of the feedback unit 320 is transmitted via the flip-flop 310.

After the point of time t2', the output signal n3 of the flip-flop 310 is inverted via the first inversion unit 340, the delay unit 350 delays an output signal of the first inversion unit 340, and the second inversion unit 360 inverts an output signal of the delay unit 350 and outputs the inverted signal as an output signal OUT. Thus, the output signal OUT changes from the second logic state to the first logic state at a point of time t5'. A period of time between the time t2' and the time t5' is a time delay during which the output signal n3 of the flip-flop 310 is transmitted via the first inversion unit 340, the delay unit 350 and the second inversion unit 360.

Since the output signal n3 of the flip-flop 310 is in the first logic state after the point of time t2', the output signal n1 of the feedback unit 320 changes to the second logic state at the point of time t2'. A period of time between the time t2' and the time t3' is a time delay during which the output signal n3 is transmitted via the feedback unit 320. Since the selection unit 330 operates in response to the output signal n1 of the feedback unit 320, which is in the second logic state after the point of time t2', the selection unit 330 outputs the second clock signal CLK2. In this case, since the second clock signal CLK2 is in the second logic state, the output signal n2 of the selection unit 330 changes to the second logic state at a point of time t4'. Thus, since the flip-flop 310 continues to output the output signal n3 in the first logic state, which has been output by the flip-flop 310 before, the output signal OUT is maintained in the first logic state. A period of time between the time t3' and the time t4' is a time delay during which the selection unit 330 operates in response to the output signal n1 of the feedback unit 320.

Then, since the second clock signal CLK2 changes from the second logic state to the first logic state at a point of time t6', the flip-flop 310 outputs the output signal n3 of the flip-flop 310 in the second logic state via the output node Q of the flip flop 310. Thus, the output signal n3 of the flip-flop 310 changes from the first logic state to the second logic state at a point of time t7'. A period of time between the time t6' and the time t7' is a time delay during which the output signal n1 of the feedback unit 320 is transmitted via the flip-flop 310.

After the point of time t7', the output signal n3 of the flip-flop 310 is inverted by the first inversion unit 340, the delay unit 350 delays an output signal of the first inversion unit 340, and the second inversion unit 360 inverts an output signal of the delay unit 350 and outputs the inverted signal as the output signal OUT. Thus, the output signal OUT changes from the first logic state to the second logic state at a point of time t10'. A period of time between the time t7' and the time t10' is a time delay during which the output signal n3 of the flip-flop 310 is transmitted via the first inversion unit 340, the delay unit 350 and the second inversion unit 360.

Since the output signal n3 of the flip-flop 310 is in the second logic state after the period of time t10', the output signal n1 of the feedback unit 320 changes to the first logic state at the period of time t10'. A period of time between the time t6' and the time t7' is a time delay during which the output signal n3 of the flip-flop 310 is transmitted via the feedback unit 320. Since the selection unit 330 operates in response to the output signal n1 of the feedback unit 320 in the first logic state, the selection unit 330 outputs the first clock signal CLK1. In this case, since the first clock signal CLK1 is in the second logic state, the output signal n2 of the selection unit 330 changes to the second logic state at a point of time t9'. Thus, since the flip-flop 310 continues to output the output signal n3 in the second logic state, which has been output by the flip-flop 310 before, the output signal OUT is maintained in the second logic state. A period of time between the time t8' and the time t9' is a time delay during which the selection unit 330 operates in response to the output signal n1 of the feedback unit 320.

According to the present embodiment, a duty cycle can be exactly corrected so as to have a duty ratio of 50:50 even if the duty cycle correction circuit 300 operates at high speed. In the duty cycle correction circuit 100 of FIG. 1, referring to FIGS. 1 and 2, the period of time between the time t1 and the time t2 is a time delay during which the output signal n1 of the feedback unit 320 in the first logic state is transmitted via the flip-flop 110, and the period of time between t9 and t10 is a time delay during which the output signal n1 of the feedback unit 320 in the second logic state is transmitted via the flip-flop 110. In this case, the period of time between the time t1 and the time t2 might not be the same as the period of time between t5 and t6.

In the duty cycle correction circuit 300 of FIG. 3, referring to FIGS. 3 and 4, the period of time between t1' and t2' is a time delay during which the output signal n1 of the feedback unit 320 in the first logic state is transmitted via the flip-flop 310, and the period of time between t2' and t5' is a time delay during which the output signal n3 of the flip-flop 310, which is in the first logic state, is transmitted via the first inversion unit 340, the delay unit 350 and the second inversion unit 360. That is, the period of time between the time t1' and the time t5' is the sum of the delay or difference during which the output signal n1 of the feedback unit 320 in the first logic state is transmitted via the flip-flop 310 and the first inversion unit 340 and the time delay during which the signal (i.e., the output signal of the first inversion unit 340) in the second logic state is transmitted via the delay unit 350 and the second inversion unit 360.

The period of time between t6' and t7' is a time delay during which the output signal n1 of the feedback unit 320 in the second logic state is transmitted via the flip-flop 310, and the period of time between the time t7' and the time t10' is a time delay during which the output signal n3 of the flip-flop 310, which is in the second logic state, is transmitted via the first inversion unit 340, the delay unit 350 and the second inversion unit 360. That is, the period of time between the time t6' and the time t10' is the sum of the time delay during which the output signal n1 of the feedback unit 320 in the first logic state is transmitted via the flip-flop 310 and the first inversion unit 340 and the delayed time when the signal (i.e., the output signal of the first inversion unit 340) in the first logic state is transmitted via the delay unit 350 and the second inversion unit 360.

Accordingly, the period of time between the time t1' and the time t5' is the same as the period of time between the time t6' and the time t10'. This is because the time delay during which the signal in the first logic state is transmitted via the flip-flop 310 is the same as the time delay during which the signal in the first logic state is transmitted via the delay unit 350, and the time delay during which the signal in the second logic state is transmitted via the flip-flop 310 is the same as the time delay during which the signal in the second logic state is transmitted via the delay unit 350. Similarly, a period of time between the time t11' and the time t12' is the same as a period of time between the time t13' and the time t14'. Thus, the duty cycle correction circuit 300 of FIG. 3 can exactly correct the duty cycle so as to have a duty ratio of 50:50 according to the delay in the flip-flop 310.

Figure 5:
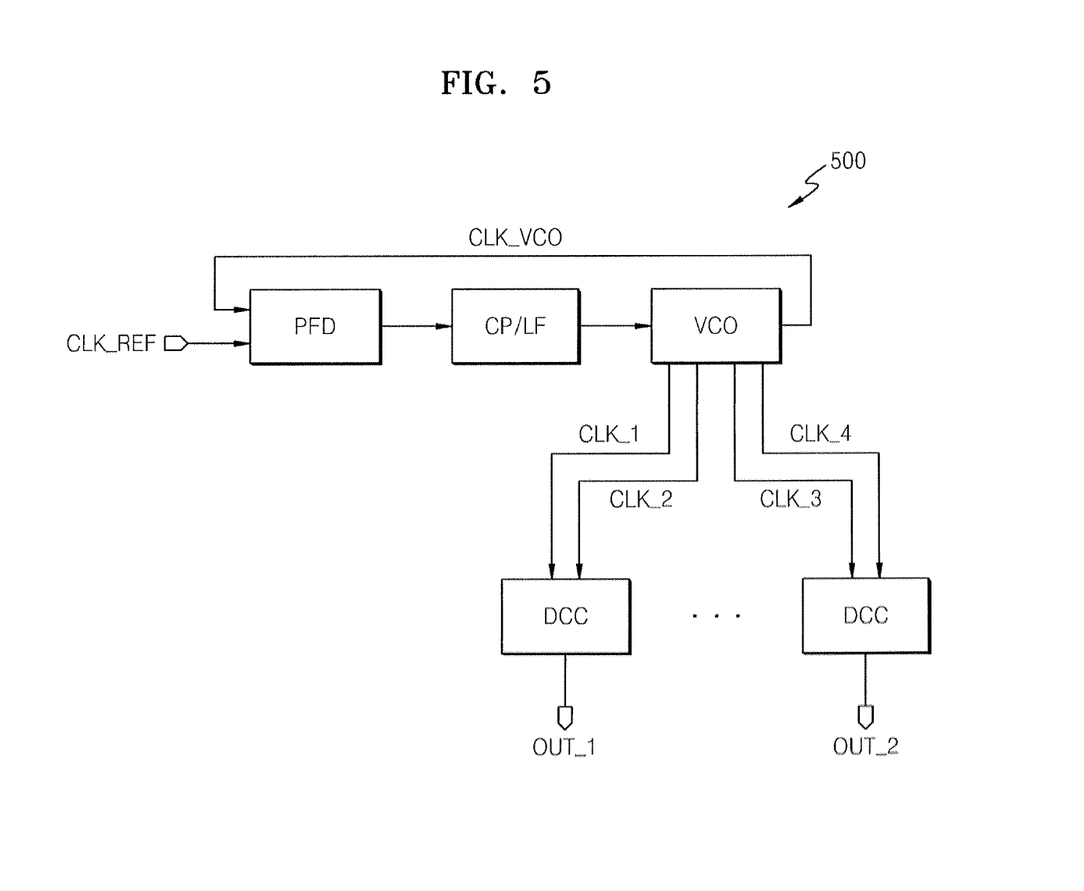
FIG. 5 is a block diagram illustrating a duty cycle correction circuit apparatus according to another embodiment of the present general inventive concept.

FIG. 5 is a block diagram illustrating a duty cycle correction circuit 500 according to another embodiment of the present general inventive concept.

Referring to FIGS. 1 through 5, the duty cycle correction circuit 500 may be embodied using a phase locked loop PLL outputting a plurality of multiphase clock signals. Referring to FIG. 5, the duty cycle correction circuit 500 according to the current embodiment of the present general inventive concept may include a phase frequency detector PFD, a charge pump and loop filter CP/LF, a voltage controlled oscillator VCO and a duty cycle corrector DCC.

The phase frequency detector PFD compares a reference clock signal CLK_REF and an internal clock signal CLK_VCO so as to detect and output a phase difference between the reference clock signal CLK_REF and the internal clock signal CLK_VCO, and the charge pump and loop filter CP/LF outputs a voltage signal in response to an output signal of the phase frequency detector PFD. The voltage controlled oscillator VCO outputs a signal which is phase-adjusted from the internal clock signal CLK_VCO, in response to the voltage signal. In addition, the voltage controlled oscillator VCO outputs a plurality of clock signals with different phases, such as multiphase clock signals CLK_1, CLK_2, CLK_3 and CLK4. In FIG. 5, the voltage controlled oscillator VCO outputs four clock signals CLK_1, CLK_2, CLK_3 and CLK4 with different phases. However, it will be obvious to one of ordinary skill in the art that the present invention is not limited thereto.

The duty cycle corrector DCC may be the duty cycle correction circuit 100 or 300 illustrated in FIG. 1 or 3, and thus a description thereof is not repeated. The duty cycle corrector DCC uses two clock signals with a half-period phase difference therebetween from among the clock signals CLK_1, CLK_2, CLK_3 and CLK4 which are output by the voltage controlled oscillator VCO. For example, it is assumed that the clock signals CLK_1 and CLK_2 have a half-period phase difference therebetween and the clock signals CLK_3 and CLK4 also have a half-period phase difference therebetween. In this case, when the clock signal CLK_1 output by the voltage controlled oscillator VCO is used instead of the first clock signal CLK1 of FIG. 1 or 3, the clock signal CLK_2 output by the voltage controlled oscillator VCO may be used instead of the second clock signal CLK2 of FIG. 1 or 3. Likewise, when the clock signal CLK_3 output by the voltage controlled oscillator VCO is used instead of the first clock signal CLK1 of FIG. 1 or 3, the clock signal CLK_4 output by the voltage controlled oscillator VCO may be used instead of the second clock signal CLK2 of FIG. 1 or 3.

Thus, according to the present embodiment, without correcting a duty ratio by conventionally using a divider such as a phase locked loop PLL, the duty ratio can be corrected to 50:50 using the duty cycle correction circuit 100 or 300 illustrated in FIG. 1 or 3.

Figure 6:
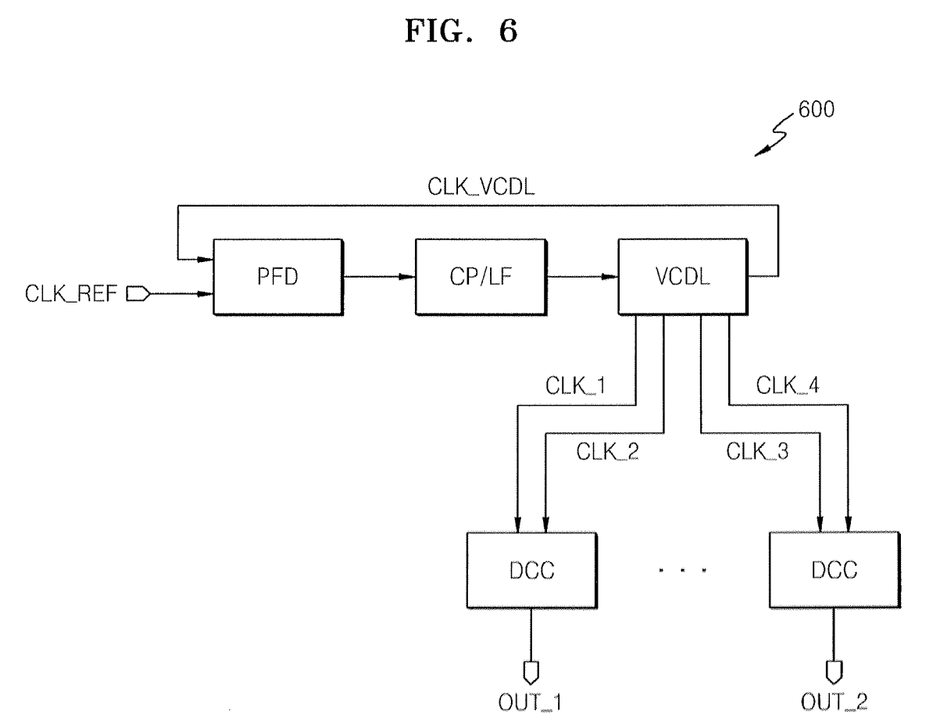
FIG. 6 is a block diagram illustrating a duty cycle correction circuit apparatus according to another embodiment of the present general inventive concept

FIG. 6 is a block diagram illustrating a duty cycle correction circuit 600 according to another embodiment of the present general inventive concept.

Referring to FIGS. 1 through 6, the duty cycle correction circuit 600 may embodied using a delay locked loop DLL outputting a plurality of multiphase clock signals. The duty cycle correction circuit 600 is the same as the duty cycle correction circuit 500 of FIG. 5 except that the duty cycle correction circuit 600 includes a voltage controlled delay line VCDL instead of the voltage controlled oscillator VCO illustrated in FIG. 5. That is, since the voltage controlled delay line VCDL outputs an internal clock signal CLK-VCDL to an PFD as a feedback signal to be used to compared with a reference clock signal CLK-REF and outputs a plurality of clock signals with different phases, such as multiphase clock signals CLK_1, CLK_2, CLK_3 and CLK4, like in the case of the voltage controlled oscillator VCO of the duty cycle correction circuit 500 illustrated in FIG. 5, the detailed operation of correcting the duty ratio in the duty cycle correction circuit 600 is similar to that of the duty cycle correction circuit 500 of FIG. 5. Thus, a description of the operation of the duty cycle correction circuit 600 is not provided here. Like in the case of FIG. 5, in FIG. 6, the voltage controlled delay line VCDL outputs four clock signals CLK_1, CLK_2, CLK_3 and CLK4 with different phases. However, the present general inventive concept is not limited thereto. The number of clock signals can be more than four, and the difference phases can be more than four.

Figure 7A:
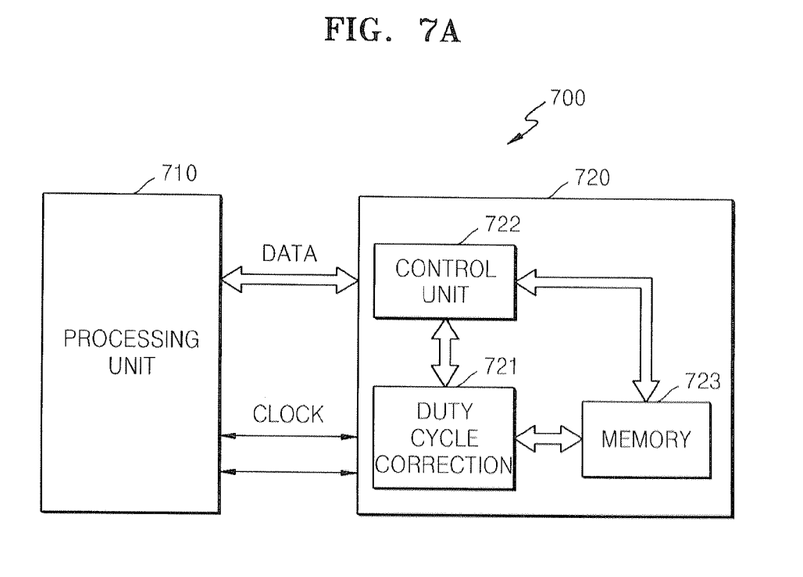
FIGS. 7A and 7B are diagrams illustrating an electronic apparatus having a duty cycle correction circuit apparatus according to an embodiment of the present general inventive concept.
Figure 7B:
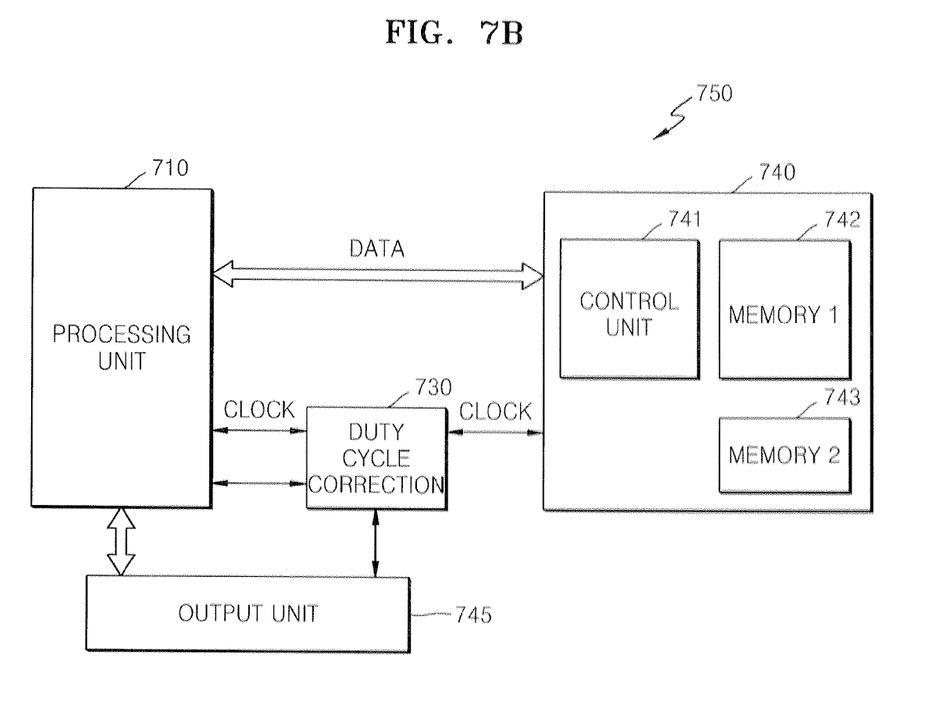

FIGS. 7A and 7B are diagrams illustrating electronic apparatuses 700 and 750 having a duty cycle correction circuit apparatus according to an embodiment of the present general inventive concept. The electronic apparatus 700 may include a processing unit 710 and a memory unit 720 connected to the processing unit 710 through a data line and a clock line to output to and/or receive from the processing unit 710 data and a clock signal. The memory unit 720 includes a duty cycle correction unit 721, a control unit 722, and a memory 723 to store the data. The duty cycle correction unit 721 may be similar to the duty cycle correction circuit apparatus 100, 300, 500, and/or 600 of FIGS. 1-6. One or more corrected clock signal is transmitted to the control unit 722 and/or the memory unit 722. The memory unit 723 may be a semiconductor chip, such as DRAM, flash memory, SSD, etc., or a semiconductor package having the semiconductor chip. It is also possible that the memory unit 723 may be a hard disk drive.

The electronic apparatus 750 may include a processing unit 710, a memory unit 740, a duty cycle correction unit 730, and an output unit 745. The duty cycle correction unit 730 is connected between the processing unit 710 and the memory unit 740 to receive one or more clock signals and to output one or more corrected clock signals to the memory unit 740 and/or the output unit 745. The memory unit 740 may include a control unit 741, a first memory 742 and a second memory 743. The first memory 742 may be a semiconductor chip, such as DRAM, flash memory, SSD, etc., or a semiconductor package having the semiconductor chip, and the second memory unit 743 may be a hard disk drive. It is also possible that the first memory 742 and the second memory 743 are a semiconductor chip. It is also possible that the first memory 742 has a first data transfer rate and the second memory 743 has a second data transfer rate slower than the first data transfer rate. The first memory 742 may receive data from the control unit 741 to store therein. The first memory 742 and the second memory 743 may receive data from each other to store therein. The processing unit 710 processes the data received from the memory unit 740 and output the data to the output unit 745. According to characteristics of the data of the processing unit 710, the output unit 745 may have a structure to correspond to a display device to generate an image, an audio device to generate sound, a functional unit to perform an operation of the data, an communication device to communicate with an external device through a wired or wireless line, etc. In this case, the electronic apparatus 750 may be a monitor, a communication device, a cell phone, an audio and/or video apparatus, a computer, an image forming apparatus, etc. The memory unit 720 includes a control unit 741.

Figure 8A:
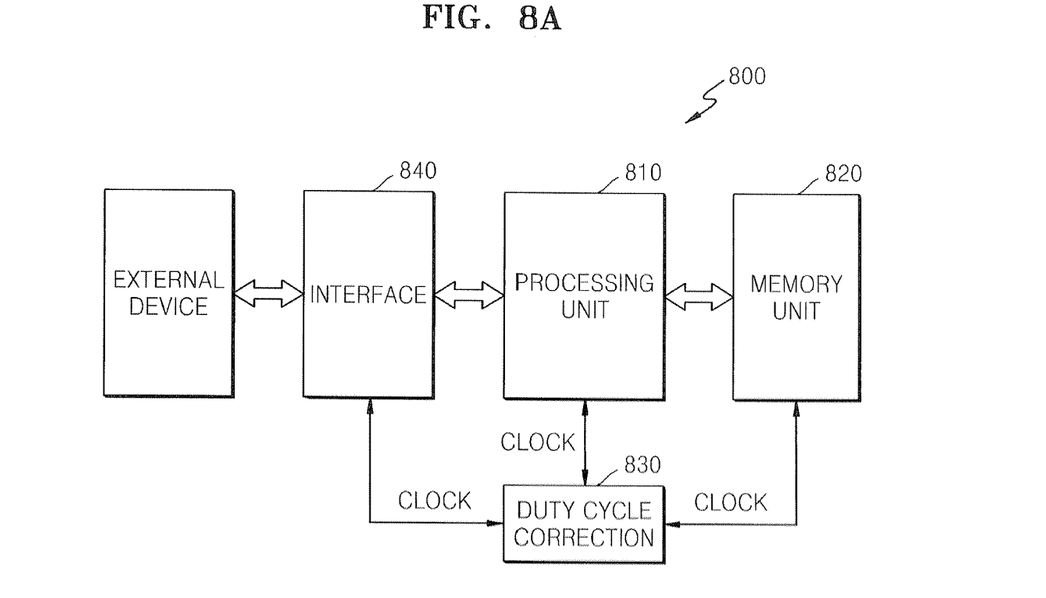
FIGS. 8A and 8B are diagrams illustrating an electronic apparatus having a duty cycle correction circuit apparatus according to an embodiment of the present general inventive concept.
Figure 8B:
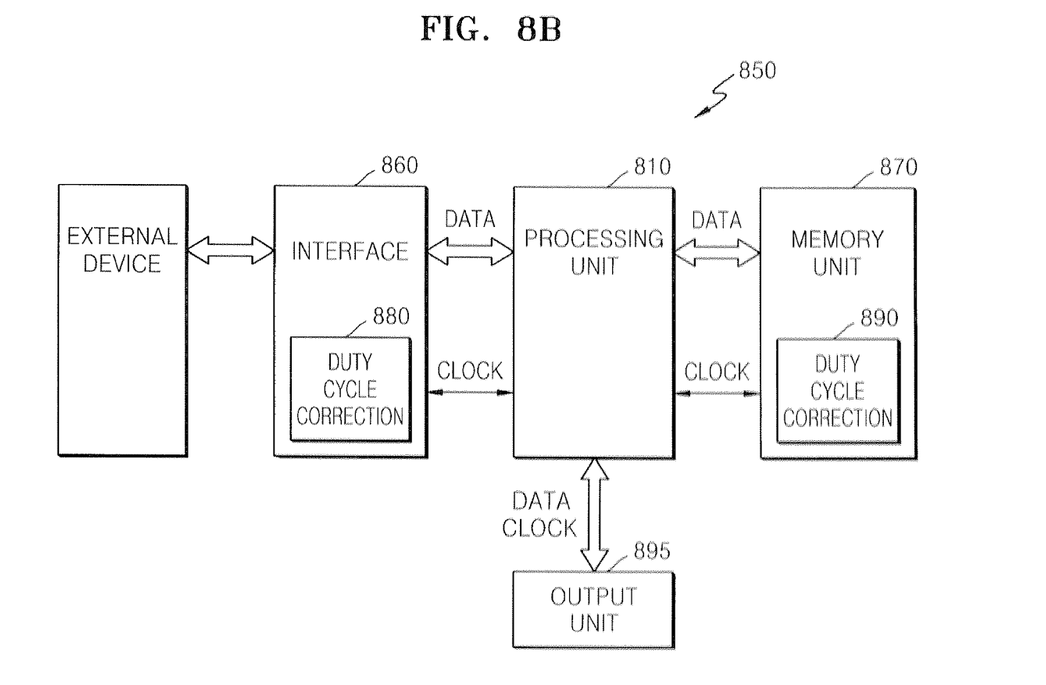

FIGS. 8A and 8B are diagrams illustrating electronic apparatuses 800 and 850 having a duty cycle correction circuit apparatus according to an embodiment of the present general inventive concept. The electronic apparatus 800 includes a processing unit 810, a memory unit 820, a duty cycle correction unit 830, and an interface unit 840. The memory unit 820 may be similar to the memory unit 720 and 740 of FIGS. 7A and 7B to store data. The duty cycle correction unit 830 receives one or more clock signals from the processing unit 810 or an external clock generating device, corrects the clock signals, and outputs the corrected clock signals to the processing unit 810, the memory unit 820, and the interface unit 840. The processing unit 810 controls the memory unit 820 to write and read data on and from the memory unit 820, and also controls the interface unit 840 to communicate with an external device to transmit or receive the data through a wired or wires communication. The interface unit 840 may receive another clock signal from the external device and output the received another clock signal to the processing unit 810. The received another clock signal can be corrected in the duty cycle correction unit 830. The corrected clock signal can be transmitted and used in the processing unit 810, the memory unit 820, and/or the interface unit 840.

The electronic apparatus 850 includes a processing unit 810, a memory unit 870, an interface unit 860, and an output unit 895. The memory unit 870 may be similar to the memory unit 720 and 740 of FIGS. 7A and 7B, and stores data which can be processed in the processing unit 810, which can be used to control the output unit 895, or which can be transmitted to the external device. The memory unit 870 may include a duty cycle correction unit 890 which is similar to the duty cycle correction circuit apparatus 100, 300, 500, and/or 600 of FIGS. 1-6. The duty cycle correction unit 890 receives one or more clock signals from the processing unit 810 to correct the clock signals to be used to read or write data on a memory space of the memory of the memory unit 870. The interface unit 860 may also include another duty cycle correction unit 880 to receive one or more clock signal from the processing unit 860 to correct the clock signal to be used to communicate with the external device. The another duty cycle correction unit 880 may be similar to the duty cycle correction circuit apparatus 100, 300, 500, and/or 600 of FIGS. 1-6. The processing unit 810 controls the memory unit 870 to write and read data on and from the memory unit 820 using the corrected clock signal, and also controls the interface unit 840 to communicate with an external device to transmit or receive the data through a wired or wires communication. The interface unit may receive another clock signal from the external device and output the received another clock signal to the processing unit 810. The output unit 895 may be similar to the output unit 745 and 830 of FIGS. 7B and 8A.

According to the present general inventive concept, using clock signals with a half-period phase difference therebetween and a simple digital circuit, a duty cycle correction circuit can correct a duty ratio to 50:50 regardless of an initial condition. The initial condition can be referred to a condition where clock signals are not synchronized, a condition wherein any one of a rising edge and a falling edge of the clock signals is transmitted, a condition wherein the rising edge and the falling edge of a clock signal and the rising edge and the falling edge of another clock signal are not a same ratio, etc. However, the present general inventive concept is not limited thereto.

While the present general inventive concept has been particularly shown and described with reference to exemplary embodiments thereof, it will be understood by one of ordinary skill in the art that various changes in form and details may be made therein without departing from the spirit and scope of the present general inventive concept as defined by the following claims.

What is claimed is:

1. A duty cycle correction circuit apparatus comprising:
   a flip-flop;
   a feedback unit connected between an input node and an output node of the flip-flop to invert an output signal of the flip-flop and to output the inverted signal as an output signal of the feedback unit; and
   a selection unit to select and output one of a first clock signal and a second clock signal to the flip-flop in response to the output signal of the feedback unit,
   wherein the first clock signal has a half-period phase difference with respect to the second clock signal.

2. The duty cycle correction circuit apparatus of claim 1, wherein the selection unit outputs the first clock signal when the output signal of the feedback unit is in a first logic state, and the selection unit outputs the second clock signal when the output signal of the feedback unit is in a second logic state.

3. The duty cycle correction circuit apparatus of claim 1, wherein the feedback unit comprises an inverter.

4. The duty cycle correction circuit apparatus of claim 1, further comprising:
   a phase frequency detector to compare a reference clock signal and an internal clock signal so as to detect a phase difference therebetween;
   a charge pump and loop filter to output a voltage signal in response to an output signal of the phase frequency detector; and
   a voltage controlled oscillator to output the internal clock signal in response to the voltage signal.

5. The duty cycle correction circuit apparatus of claim 4, wherein:
   the voltage controlled oscillator outputs a plurality of clock signals with different phases; and the first clock signal and the second clock signal are clock signals with a half-period phase difference therebetween from among the clock signals output by the voltage controlled oscillator.

6. The duty cycle correction circuit apparatus of claim 1, further comprising:
   a phase frequency detector to compare a reference clock signal and an internal clock signal so as to detect a phase difference therebetween;
   a charge pump and loop filter output a voltage signal in response to an output signal of the phase frequency detector; and
   a voltage controlled delay line to output the internal clock signal in response to the voltage signal.

7. The duty cycle correction circuit apparatus of claim 6, wherein:
   the voltage controlled delay line outputs a plurality of clock signals with different phases; and
   the first clock signal and the second clock signal are clock signals with a half-period phase difference therebetween from among the clock signals output by the voltage controlled delay line.

8. The duty cycle correction circuit apparatus of claim 1, further comprising:
   a first inversion unit inverting the output signal of the flip-flop and outputting the inverted signal as an output signal of the first inversion unit;
   a delay unit delaying the output signal of the first inversion unit by the delay during which the output signal of the feedback unit is transmitted via the flip-flop; and
   a second inversion unit inverting an output signal of the delay unit and outputting the inverted signal as an output signal of the second inversion unit.

9. The duty cycle correction circuit apparatus of claim 8, wherein each of the first inversion unit and the second inversion unit comprises an inverter.

10. The duty cycle correction circuit apparatus of claim 8, wherein the delay unit comprises an inverter chain.

11. The duty cycle correction circuit apparatus of claim 8, further comprising:
   a phase frequency detector comparing a reference clock signal and an internal clock signal so as to detect a phase difference therebetween;
   a charge pump and loop filter outputting a voltage signal in response to an output signal of the phase frequency detector; and
   a voltage controlled oscillator outputting the internal clock signal in response to the voltage signal.

12. The duty cycle correction circuit apparatus of claim 11, wherein:
   the voltage controlled oscillator outputs a plurality of clock signals with different phases; and
   the first clock signal and the second clock signal are clock signals with a half-period phase difference therebetween from among the clock signals output by the voltage controlled oscillator.

13. The duty cycle correction circuit apparatus of claim 8, further comprising:
   a phase frequency detector to compare a reference clock signal and an internal clock signal so as to detect a phase difference therebetween;
   a charge pump and loop filter to output a voltage signal in response to an output signal of the phase frequency detector; and
   a voltage controlled delay line to output the internal clock signal in response to the voltage signal.

14. The duty cycle correction circuit apparatus of claim 13, wherein:
   the voltage controlled delay line outputs a plurality of clock signals with different phases; and
   the first clock signal and the second clock signal are clock signals with a half-period phase difference therebetween from among the clock signals output by the voltage controlled delay line.

15. An electronic apparatus comprising:
   a memory unit comprising a duty cycle correction unit having a flip-flop, a feedback unit connected between an input node and an output node of the flip-flop to invert an output signal of the flip-flop and to output the inverted signal as an output signal of the feedback unit, and a selection unit to select and output one of a first clock signal and a second clock signal to the flip-flop in response to the output signal of the feedback unit, the memory unit further comprising a memory to store or read data according to the output signal of the flip flop,
   wherein the first clock signal has a half-period phase difference with respect to the second clock signal.

16. The electronic apparatus of claim 15, wherein the memory comprises a first memory having a first transfer rate to read and write the data according to the output signal of the flip flop, and a second memory having a second transfer rate to read and write the data according to the output signal of the flip flop.

17. The electronic apparatus of claim 15, further comprising:
   an output unit to perform an operation according to the data of the memory unit.

18. The electronic apparatus of claim 17, wherein the output unit comprises one of a first unit to generate an image, a second unit to generate sound, and a third unit to communicate with an external device according to the data of the memory unit.

19. The electronic apparatus of claim 18, further comprising:
   a processing unit to control the memory to write and read the data, and to control the output unit according to the data.

20. A duty cycle correction circuit apparatus comprising:
   a circuit unit to receive at least one of first and second clock signals and to generate an output signal according to a state change of the at least one of the first and second clock signals;
   a feedback unit to invert the output signal of the circuit unit; and
   a selection unit to select one of the first clock signal and the second clock signal as the at least one clock signal according to the inverted output signal of the circuit unit.

* * * * *